United States Patent [19]
Bullock

[11] Patent Number: 5,968,374
[45] Date of Patent: Oct. 19, 1999

[54] METHODS AND APPARATUS FOR CONTROLLED PARTIAL ASHING IN A VARIABLE-GAP PLASMA PROCESSING CHAMBER

[75] Inventor: David M. Bullock, Highland Village, Tex.

[73] Assignee: Lam Research Corporation, Fremont, Calif.

[21] Appl. No.: 08/822,588

[22] Filed: Mar. 20, 1997

[51] Int. Cl.$^6$ .............................. H01B 13/00; B44C 1/22
[52] U.S. Cl. .............................. 216/16; 216/41; 156/345; 438/725
[58] Field of Search .............................. 156/345; 216/2, 216/16; 438/714, 725, 727

[56] References Cited

U.S. PATENT DOCUMENTS

| | | | |
|---|---|---|---|
| 4,241,165 | 12/1980 | Hughes et al. | 430/269 |
| 4,431,898 | 2/1984 | Reinberg et al. | 219/121 |
| 4,812,201 | 3/1989 | Sakai et al. | 156/643 |
| 4,861,424 | 8/1989 | Fujimura et al. | 156/643 |
| 5,171,393 | 12/1992 | Moffat | 156/345 |
| 5,228,052 | 7/1993 | Kikuchi et al. | |
| 5,763,328 | 6/1998 | Yoshihara et al. | 438/725 |

FOREIGN PATENT DOCUMENTS

| | | |
|---|---|---|
| 0 367 568 A1 | 5/1990 | European Pat. Off. . |
| WO 97 04476 | 2/1997 | WIPO . |

OTHER PUBLICATIONS

Flam, D. L. "Dry Plasma Resist Stripping Part I: Overview of Equipment," 35 (1992) Aug., No. 8, Solid State Technology, Westford, MA, XP000335216, pp. 37–39.

Flam, D. L., "Dry Plasma Resist Stripping Part II: Physical Processes," 35 (1992) Sep., No. 9, Solid State Technology, Westford, MA, XP000328430, pp. 43–48.

*Primary Examiner*—R. Bruce Breneman
*Assistant Examiner*—Alva C Powell
*Attorney, Agent, or Firm*—Beyer & Weaver, LLP.

[57] ABSTRACT

A method in a variable-gap plasma processing chamber for controlled removal of at least a portion of an upper crust of a photoresist layer disposed above a substrate. The upper crust represents a hardened upper layer of the photoresist layer. The method includes loading the substrate into the variable-gap plasma processing chamber. The method further includes flowing an ash source gas comprising $O_2$ into the variable-gap plasma processing chamber. The ash source gas is substantially free of an $O_2$ bombarding gas. The method further includes performing the controlled removal of at least the portion of the upper crust of the photoresist layer with a plasma struck from the ash source gas while a gap between an upper surface of the substrate and an upper electrode of the variable-gap plasma processing chamber is maintained at a predefined wide gap distance. Preferably, the predefined wide gap distance represents a distance sufficiently wide for the substrate to be loaded into the variable-gap plasma chamber without having to alter the gap.

32 Claims, 9 Drawing Sheets

METHODS AND APPARATUS FOR CONTROLLED PARTIAL ASHING IN A VARIABLE-GAP PLASMA PROCESSING CHAMBER

BACKGROUND OF THE INVENTION

The present invention relates to the manufacture of integrated circuits (ICs). More particularly, the present invention relates to improved techniques for removing a controlled amount of the photoresist layer while leaving the remaining thickness of the photoresist layer sufficiently protective of underlying layers during a subsequent etch step.

The use of photoresist is well known in the manufacture of semiconductor devices. In the fabrication of semiconductor devices, e.g., semiconductor integrated circuits (ICs) or flat panel displays, devices such as component transistors are typically formed on a substrate, e.g., a silicon wafer or a glass panel. The substrate typically includes a plurality of layers out of which semiconductor device components are formed, e.g., via etching, doping, or the like. To facilitate the etching of one or more layers of the layer stack, an overlaying photoresist layer is typically applied atop the blanket-deposited underlying layer to be etched. The applied photoresist layer may then be patterned (e.g., through a conventional photoresist technique) to facilitate the etching of the underlying layer or layers. By way of example, one such photoresist technique involves the patterning of the applied photoresist layer by exposing the photoresist material in a contact or stepper lithography system, and the development of the photoresist material to form a mask to facilitate subsequent etching. Using an appropriate etchant, the areas of the underlying layer to be etched that are unprotected by the photoresist mask are then etched away, leaving behind the desired pattern or features.

FIG. 1 illustrates an exemplary layer stack 100 having thereon a patterned photoresist layer 102. Area 104 in patterned photoresist layer 102 represents the area where etching of the underlying layer 106 may occur in a subsequent etch step.

Substrate 108, representing for example a silicon wafer, is shown disposed below underlying layer 106. It should be understood that underlying layer 106 may represent one or more component layers, the exact number and composition of which are somewhat irrelevant for the purposes of the present invention. The patterned photoresist layer may be employed to etch a single or multiple component layers within underlying layer 106 (through the use of appropriately formulated etch recipes).

After etching is completed, the protective mask in patterned photoresist layer 102 is typically stripped away in a process commonly known as strip ashing. Strip ashing involves oxidizing the protective photoresist mask to form volatile byproduct gasses, which may then be exhausted away.

In the prior art, strip ashing may be performed in a variable-gap plasma processing system using oxygen and helium as component ash source gasses. When the ash source gas mixture comprising helium and oxygen is introduced into the plasma processing chamber, RF energy excitation ignites a plasma out of the ash source gasses. Helium is employed as the bombardment agent to create more ionized oxygen species ($O^+$) in the plasma. The increase in the number of ionized oxygen species increases the rate of photoresist oxidation, thereby increasing the rate at which the photoresist mask is ashed or removed. If the goal is to quickly remove the photoresist mask, the use of helium is highly advantageous as it reduces the time required for ashing, thereby improving substrate throughput and decreasing the cost of ownership of the plasma processing system.

To keep the ash rate high, prior art strip ashing techniques typically employ a fairly narrow gap between the upper surface of the substrate and the lower surface of the upper electrode of the variable-gap plasma processing chamber in order to increase ion density. To facilitate discussion, FIG. 2A depicts a typical plasma processing chamber 200, representing a plasma processing chamber typically employed in the prior art to strip the photoresist. In the present example, plasma processing chamber 200 represents a plasma processing chamber of a plasma processing system known as the Rainbow 4400™, which is available from Lam Research Corporation of Fremont, Calif. Although the Rainbow 4400™ is employed herein to facilitate discussion, it should be borne in mind that the techniques disclosed herein are not limited to this particular configuration; the inventive and disclosed ash techniques may be adapted, using knowledge commonly possessed by those skilled in the art, to other plasma processing chamber configurations.

Plasma processing chamber 200 typically includes a lower electrode or chuck 202, which is typically grounded. Substrate 204, representing a substrate having thereon a photoresist layer to be strip ashed, is typically disposed above lower electrode 202 during strip asking.

An upper electrode 206 is disposed above substrate 204 and is separated therefrom by a gap 208. Upper electrode 206 is mounted to a movable backing plate 210, typically in the form of a large circular metal disk. Movable backing plate 210 and upper electrode 206 may be moved along the direction of the z axis by a gap drive assembly which includes a plurality of lead screws 212, a chain 214, and a gap drive motor 216. By changing the direction of rotation of gap drive motor 216, movable backing plate 210 and upper electrode 206 may be moved toward or away from electrode 202, thereby varying the size of gap 208.

During the ash process, the pressure within plasma processing chamber 202 is typically maintained at a lower pressure than the ambient environment pressure. To maintain the pressure differential between the interior of plasma processing chamber 200 and the ambient pressure, seals 220 are typically provided around the periphery of movable backing plate 210. Seals 220, of which there are two in FIG. 2A, are typically formed of a relatively non-reactive sealing material such as a suitable rubber material, e.g., Viton™ rubber. To reduce friction between seals 220 and the interior surface of chamber wall 224 as backing plate 210 is moved toward or away from the substrate, seals 220 are typically lubricated with a suitable lubricant.

To facilitate strip ashing, an ash source gas, e.g., $O_2$/helium in the case of the prior art strip ash, is typically flowed into chamber interior 226. In the configuration of FIG. 2A, upper electrode 206 has a shower head configuration, i.e., upper electrode 206 is provided with a plurality of apertures for releasing ash source gases into chamber interior 226. However, the ash source gases may also be provided through other mechanisms, e.g., via apertures in chamber wall 224 or a gas ring surrounding lower electrode 202.

An RF power source 22b is then turned on to provide RF energy to upper electrode 206. RF power source 228 is typically coupled to upper electrode 206 via an RF tuning network 230 of a conventional design. RF tuning network 230 functions to minimize the impedance between RF power source 228 and plasma processing chamber 200, thereby maximizing power delivery. The supplied RF power ignites or strikes the plasma from the supplied ash source gases within chamber interior 226 to strip away the photoresist. Reaction byproduct gasses are then exhausted away through an exhaust port 240. Exhaust port 240 may be coupled to an automatic pressure control (APC) system 242, which automatically varies the rate of the gas exhausted through exhaust port 240 to maintain the desired chamber interior pressure.

As mentioned earlier, prior art strip ashing techniques have typically focused on optimizing the process to achieve a high rate of photoresist removal. It has been found, however, that the complete removal or stripping of the photoresist mask is not always desirable. For example, some etch processes demand consistency in the critical dimension of the unetched features, i.e., the width and shape of the areas in underlying layer 106 that remain after etching. While conducting these etch processes, it is advantageous to employ the same photoresist mask in consecutive etches. By way of example, it may be desirable to employ photoresist mask 252 of FIG. 2B to etch through both polysilicon layer 254 and oxide layer 256 to ensure that the unetched features in polysilicon layer 254 and oxide layer 256 have substantially the same critical dimension and are substantially aligned relative to one another. In these cases, the layer stack is typically first etched with an etch that is optimized for etching through polysilicon layer 254 and then etched again with another etch process that is optimized for oxide layer 256 before photoresist mask 252 is completely stripped or removed.

It has been found, however, that consecutive etches using the same photoresist mask, e.g., photoresist mask 252, result in a hardened photoresist upper crust that is difficult to remove after the etches through the underlying layers are completed. With reference to FIG. 2B, this hardened upper crust is shown as upper crust 258. In some etch processes, upper crust 258 may be so hardened after the consecutive etch processes (which are employed to etch through the underlying layers, e.g., polysilicon layer 254 and oxide layer 256) that it is difficult to remove upper crust 258 and photoresist mask 252 afterwards. In these cases, it may be desirable to remove the built up crust after each etch step so that upper crust 258 does not have the opportunity to build up to a thickness that renders photoresist mask 252 difficult to remove after the etches through the underlying layers are completed.

The removal of an upper layer of the photoresist mask, however, presents problems that are different from those encountered by designers of prior art strip ashing processes. For one, the removal of only a thin upper layer of the photoresist mask has not been heretofore the goal of prior art ashing processes. The removal of the thin upper layer of the photoresist mask requires a uniform and controlled ashing process so that only a small portion of the photoresist mask is removed while the remaining thickness of the photoresist mask is left undisturbed to protect the underlying features during subsequent etch step or steps. This is different from the goal of prior art strip ashing processes, which focus on the highest possible photoresist removal rate (which in turn leads to the complete removal of the photoresist mask in the shortest possible period of time).

It has been found, for example, that prior art strip ashing techniques are highly unsuitable for the uniform and controlled removal of the photoresist mask upper crust. For example, the fast rate of photoresist removal of prior art strip ashing processes (about 4,000 angstroms per minute, typically) renders the process unsuitable for removing, say, the top 100 angstroms of the photoresist mask. If one were to employ the prior art strip ashing technique and simply reduce the duration of the ashing step, the high ash rate of the prior art strip ashing technique requires that the ash step be performed in as short as a few seconds. As can be appreciated by those skilled in the art, such a short duration does not permit the plasma processing chamber to stabilize. If such a short strip ash duration is employed, the remaining thickness of the PR layer tends to be highly unreliable and unrepeatable from substrate to substrate. On the other hand, if one were to employ the prior art strip ashing technique and merely reduce the RF power supplied to the top electrode in an attempt to reduce the ion density and to slow down the ash rate to achieve more control, the RF power supply typically needs to be reduced to such a level that plasma reaction may not be sustainable within the plasma processing chamber.

In view of the foregoing, there are desired improved techniques for performing uniform, and controlled removal of an upper layer portion of the photoresist mask in a plasma processing chamber.

SUMMARY OF THE INVENTION

The invention relates, in one embodiment, to a method in a variable-gap plasma processing chamber for controlled removal of at least a portion of an upper crust of a photoresist layer disposed above a substrate. The method includes loading the substrate into the variable-gap plasma processing chamber. The method further includes flowing an ash source gas comprising $O_2$ into the variable-gap plasma processing chamber. The ash source gas is substantially free of an $O_2$ bombarding gas. The method further includes performing the controlled removal of at least the portion of the upper crust of the photoresist layer with a plasma struck from the ash source gas while a gap between an upper surface of the substrate and an upper electrode of the variable-gap plasma processing chamber is maintained at a predefined wide gap distance. Preferably, the predefined wide gap distance represents a distance sufficiently wide for the substrate to be loaded into the variable-gap plasma chamber without having to alter the gap.

In another embodiment, the invention relates to a method in a plasma processing chamber for controlled removal of at least a portion of an upper crust of a photoresist layer. The photoresist layer is disposed above a substrate. The controlled removal leaves a remaining thickness of the photoresist layer sufficiently protective of an underlying layer disposed below photoresist features of the remaining thickness of photoresist layer during an etch step performed subsequent to the controlled removal. The method includes loading the substrate having thereon the upper crust into the plasma processing chamber. The method further includes flowing an ash source gas comprising $O_2$ into the variable-gap plasma processing chamber. The ash source gas is substantially free of an $O_2$ bombarding gas.

The method further includes performing controlled removal of at least a portion of the upper crust of the photoresist layer with a plasma struck from the ash source gas. The controlled removal is arranged to remove at least a portion of the upper crust of the photoresist layer at a reduced ash rate. The reduced ash rate is preferably sufficiently slow to permit the removal to take place over a duration sufficient to yield ash uniformity adequate to render the photoresist features sufficiently protective of the underlying layer during the subsequent second etch step.

These and other advantages of the present invention will become apparent upon reading the following detailed descriptions and studying the various drawings.

BRIEF DESCRIPTION OF THE DRAWINGS

To facilitate discussion.

To facilitate discussion.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the present invention, uniform and controlled partial ashing of the top layer of the photoresist mask may be performed in a variable-gap plasma processing chamber by performing the ash process at a relatively wide gap 208. The use of the wide gap results in a lower flux density in the region above the substrate, thereby slowing down the ash rate to render the ash process more controllable. By increasing gap 208 and thereby slowing down the photoresist ash rate, the RF power level may be maintained at least at a level sufficient to sustain the plasma reaction within the variable-gap plasma processing chamber without unduly raising the ash rate. The slower ash rate also yields a more uniformly ashed wafer when the ash process is terminated, e.g., after the upper layer is ashed away. Advantageously, the remaining thickness of the photoresist mask may be able to more uniformly provide protection for the underlying layers during subsequent etch steps.

To further reduce the ash rate and render the ash process more controllable, the invention, in one embodiment, advantageously employs an ash source gas that includes $O_2$ and that is substantially free of an $O_2$ bombardment gas (e.g., helium). Without the $O_2$ bombardment gas (e.g., helium) to crack the $O_2$ molecules, a lower level of $O^+$ (ionized oxygen) is produced. In a counterintuitive and nonobvious manner, the invention seeks to slow down the ash rate to achieve improved process and uniformity control instead of optimizing the process for quick ash removal, as is done in the prior art strip ash processes. The lower level of $O^+$ species results in a lower overall ash rate. If this ash source gas is employed in conjunction with the above-mentioned wide gap 208, the resulting partial ash process is substantially slower and more controllable than heretofore obtainable with prior art strip ashing processes (which focus primarily on the fastest possible photoresist removal rate to improve wafer throughput). Accordingly, it becomes possible to partially ash the top layer of the photoresist mask (e.g., in between etch processes) to render the photoresist mask easier to strip afterwards.

Figure 3:
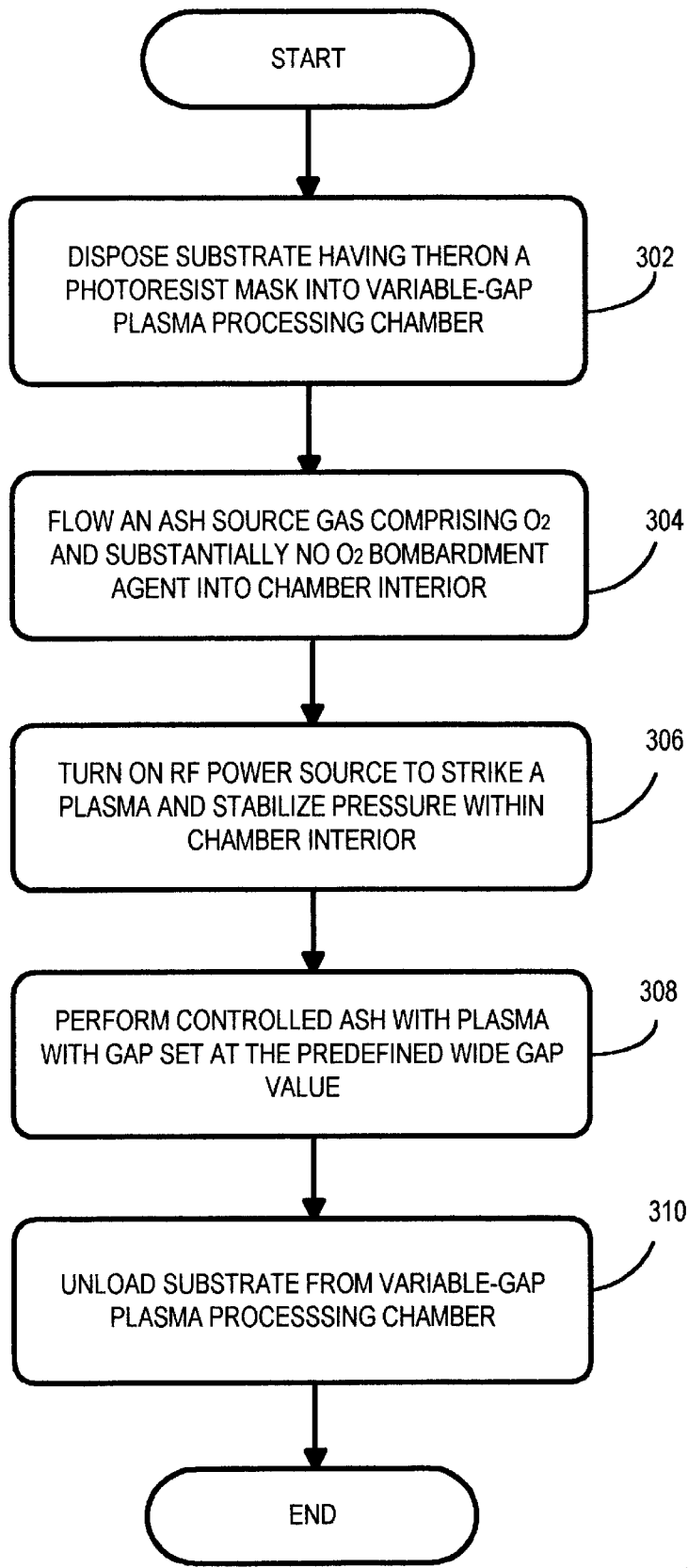
FIG. 3 illustrates, in accordance with one aspect of the present invention, the steps involved in performing the inventive controlled partial ash technique.

To further illustrate the advantages and features of the present invention, FIG. 3 illustrates, in accordance with one aspect of the present invention, the steps involved in performing the inventive controlled partial ash technique. In one embodiment, the variable-gap plasma processing chamber represents one wherein electrodes of parallel-plate types are employed to produce the plasma for ashing. It should be emphasized again that although the Rainbow 4400™ by Lam Research Corporation is employed in this disclosure to illustrate one embodiment of the inventive controlled partial ash technique, the disclosed controlled partial ash technique may be adapted to other plasma processing chamber configurations using knowledge commonly possessed by those skilled in the art in view of this disclosure.

In step 302, a substrate having thereon a photoresist mask is disposed in a variable-gap plasma processing chamber. The variable-gap plasma processing chamber of step 302 may represent a variable-gap plasma processing chamber especially employed to perform the controlled partial ash process. Alternatively, the variable-gap plasma processing chamber of step 302 may represent the processing chamber in which the substrate was etched at least once using the same photoresist mask.

In step 304, an ash source gas which includes $O_2$ and which is substantially free of an $O_2$ bombarding gas is flowed into the variable-gap plasma processing chamber. In step 306, the RF power source of the variable-gap plasma processing chamber is turned on to supply RF energy to the chamber to strike a plasma from the ash source gas and to stabilize pressure within the chamber interior. As will be discussed in detail later herein, the invention, in accordance with one aspect, provides novel and nonobvious pressure stability techniques which advantageously minimize the time required to stabilize the chamber interior pressure to the desired process pressure set point.

In step 308, the controlled partial ash process is performed with gap 208 set at a predefined wide gap value. In one embodiment, the gap employed in step 308 may be above about 3 centimeters (cm), more preferable above about 4 cm and most preferably at about 5.53 cm. The gap employed in step 308 may also represent any gap distance which permits the substrate to be loaded into the variable-gap plasma processing chamber without having to move the movable backing plate to vary the gap. Note that this wide gap value is substantially greater than the prior art gap of about 1.5 centimeters.

In step 310, the substrate may be unloaded from the variable-gap plasma processing chamber after controlled partial ashing is completed. The substrate may then be further processed through other conventional manufacturing steps and cut into dies from which integrated circuits may be fabricated.

In the following paragraphs, approximate ranges of process parameters suitable for performing the controlled partial ash technique in a variable-gap plasma processing chamber are disclosed. Although the suitable ranges are disclosed herein below in connection with 200 millimeter wafers in a Rainbow 4400™ variable-gap plasma processing system, these ranges should serve as guidelines to enable one skilled in the art to adapt the disclosed controlled partial ash technique to wafers having other dimensions and/or employing other variable-gap plasma processing systems.

Figure 1:
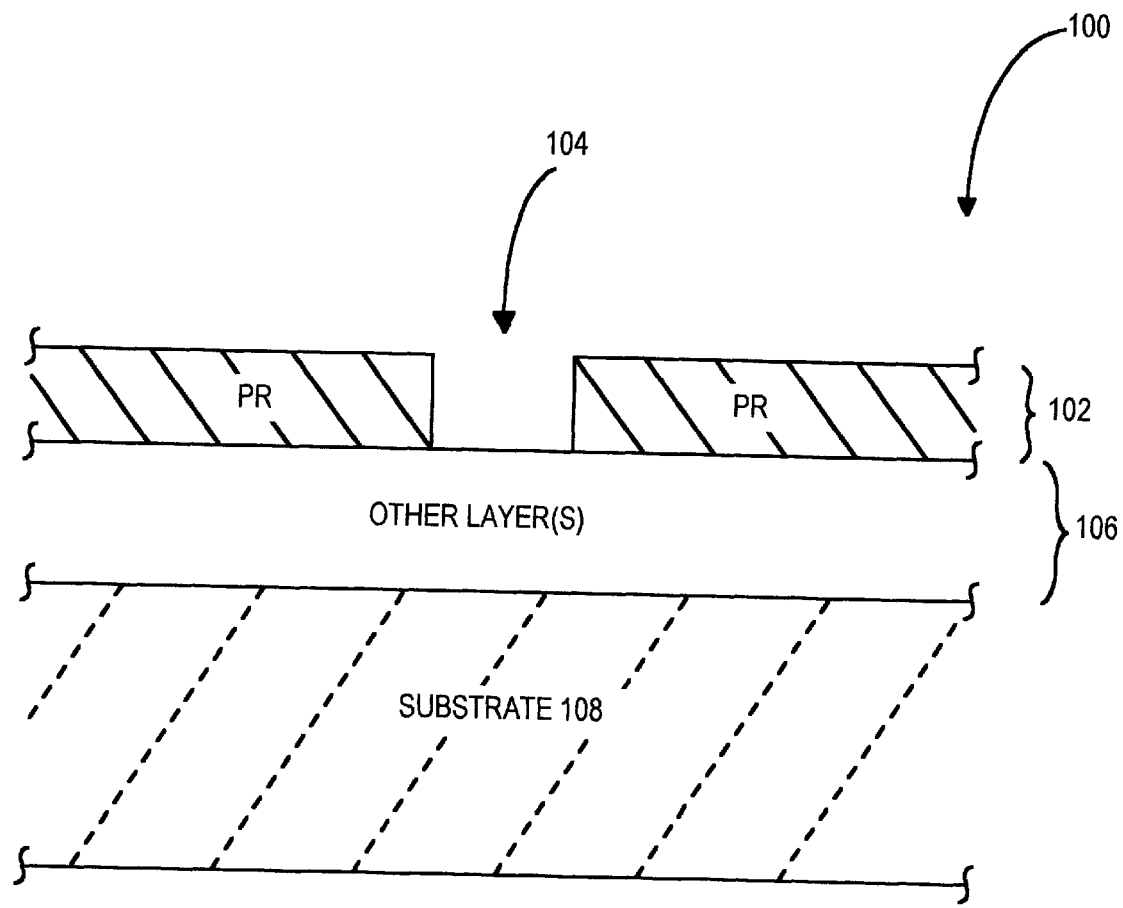
FIG. 1 illustrates an exemplary layer stack having thereon a patterned photoresist layer.
Figure 2A:
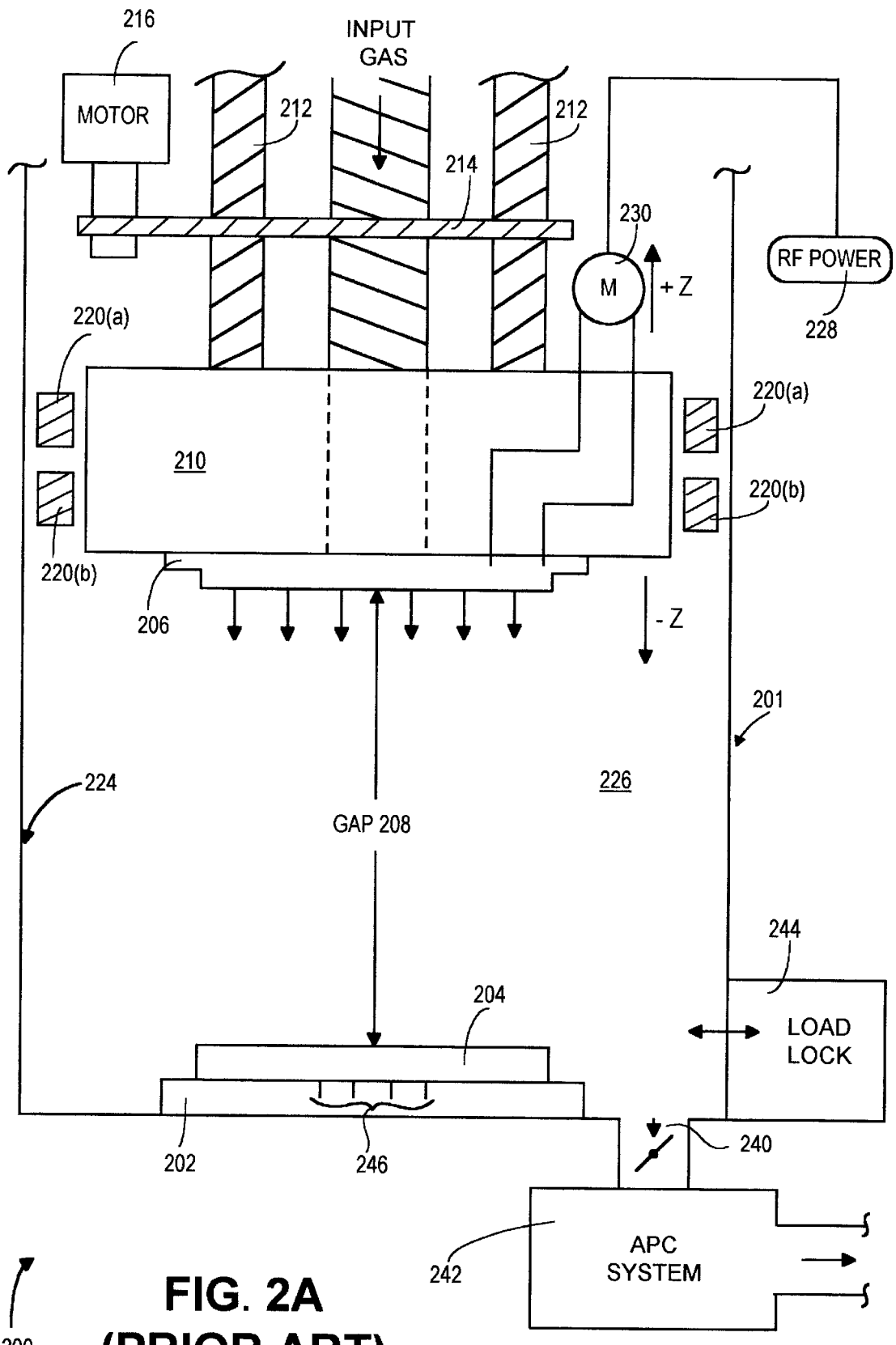
FIG. 2A depicts a variable-gap plasma processing chamber, representing a plasma processing chamber typically employed to ash the photoresist.
Figure 2B:
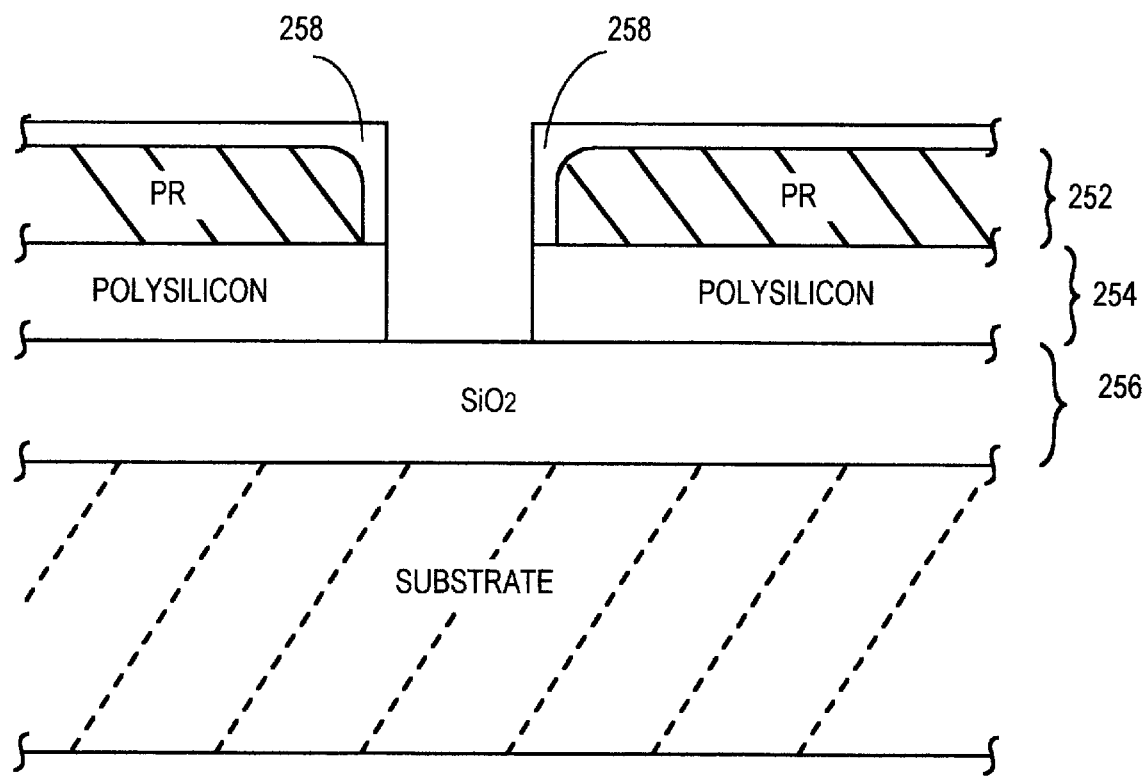
FIG. 2B illustrates photoresist features having thereon a hardened upper crust to facilitate discussion.

For a 200 millimeter wafer processed in a variable-gap plasma processing chamber such as the Rainbow 4400™ using an ash source gas that includes $O_2$ and being substantially free of an $O_2$ bombarding agent (e.g., helium), the $O_2$ flow in standard cubic centimeters per minute (sccm) is between about 110 sccm and about 190 sccm, more preferably, between about 130 sccm and about 170 sccm, and preferably, at about 150 sccm Pressure in milliTorr (mT) is maintained within the chamber interior (e.g., chamber interior 226 of FIG. 2) between about 700 mT and about 1100 mT, more preferably between 800 mT and 1000 mT, and preferably at about 800 mT. The chamber pressure may be varied to achieve the desired ash uniformity.

RF power in watts (W) is supplied to the upper electrode (e.g., upper electrode 206 of FIG. 2) at between about 300 watts and about 750 watts, more preferably between 450 watts and about 700 watts, and most preferably at about 650 watts. The upper electrode temperature is maintained at about 40° C. in one example. The temperature of the lower electrode is maintained at about 40° C. in one embodiment. In one embodiment, the top electrode and/or bottom electrode are heated and/or cooled by a liquid effluent (using for example automatic temperature control circuitries). The temperature of the chamber walls (for example chamber walls 224 of FIG. 2) may be maintained at about 60° C. In one embodiment, the temperature of the chamber wall is maintained using a common resistive heater.

The inventive controlled partial ash technique, when employed in a variable-gap plasma processing chamber, advantageously permits controlled partial ashing to proceed at a slow and controlled rate while maintaining satisfactory uniformity across the entire surface of the substrate. In one example, controlled partial ash of a 200 mm wafer in the aforementioned Rainbow 4400™ yields an ash rate of about 750 angstroms per minute (compared to about 4000 angstroms per minute of a prior art helium/$O_2$ strip ashing technique). Uniformity (at 1-σ) is found to be about 2%. This 1-σ value may be based on, for example, 17 pre ashed measurements and 17 post-ashed measurements taken at predefined locations on the wafer. Since the oxygen will not typically react with materials in the underlying layer (e.g., oxide, polysilicon, nitride, and the like) the selectivity of photoresist to an underlying layer may be thought of for all practical purposes, as being infinity.

In one aspect of the present invention, it has been found that as gap 208 is enlarged, the volume of chamber interior 226 correspondingly increases, which complicates pressure stability issues during ashing. By way of example, it has been found that the larger volume of chamber interior 226, which is caused by increasing gap 208, makes it difficult and/or time consuming to stabilize the pressure within the chamber 226 prior to controlled partial ashing.

Stabilization refers to the step taken prior to ashing to ensure that the desired process parameters are stable. In general, the process parameters such as pressure, ash gas flow rate, temperature, and the like within chamber interior 226, must be substantially stabilized before ashing can begin. This is because the values of these parameters within chamber interior 226 may fluctuate initially, e.g., when ash source gasses are initially flowed into chamber interior 226 and RF power source 228 is initially turned on. If partial ashing is conducted while the process parameters fluctuate, the partial ash results, e.g., uniformity, ash rate, selectivity, and the like, may be unpredictable and/or other than desired.

Figure 4:
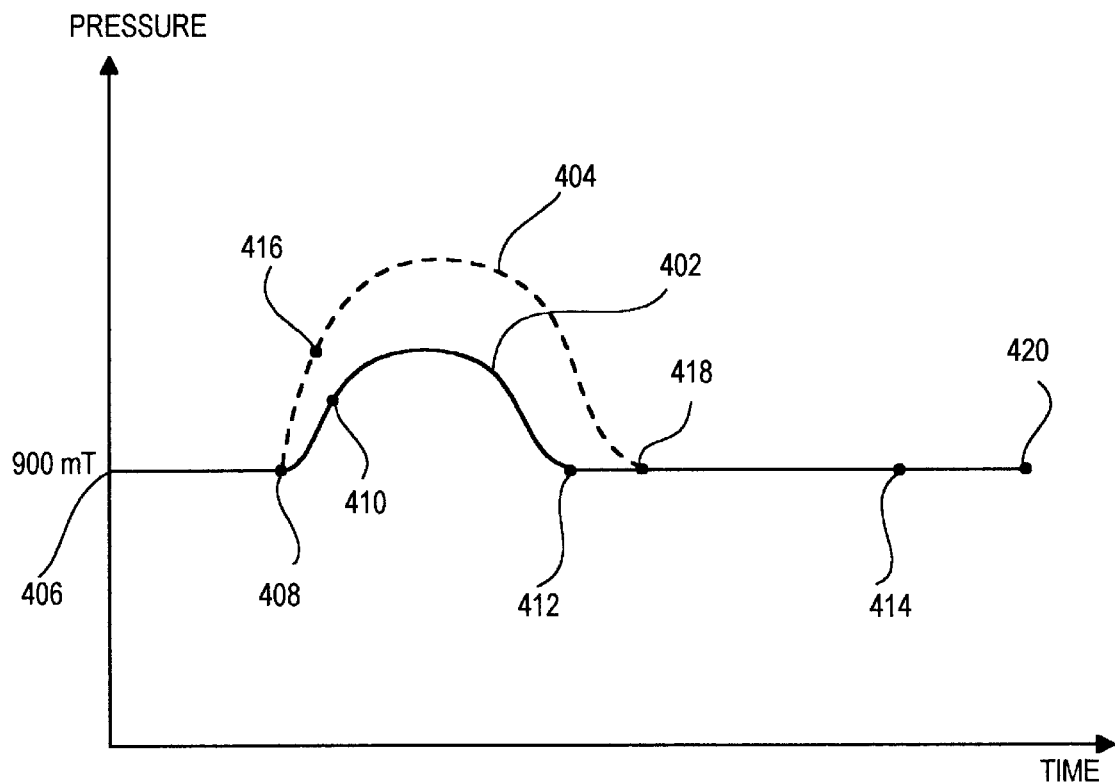
FIG. 4 depicts two pressure plots on a pressure versus time graph to illustrate the effect of increasing the chamber volume on the duration of the stabilization step.

As can be appreciated by those skilled in the art, the duration of the stability step is preferably mired to the maximum extent possible since no ashing occurs during the stability step. Longer stability steps tend to reduce substrate throughput, which lowers productivity and increases the cost of ownership of the plasma processing system It has been found, however, that with a larger gap dimension, prior art techniques of stabilizing the pressure chamber interior 226 typically result in an unacceptably time-consuming stability step. To facilitate discussion, FIG. 4 depicts two lines, 402 and 404, on a pressure versus time plot. Line 402 depicts the pressure within chamber interior 226 during a typical prior art strip ash process when the gap is relatively small, e.g., 1.5 cm in the case of one prior art $O_2$/helium strip ash process. On the other hand, line 404 depicts the pressure within chamber interior 226 for an ash process when gap 208 is increased.

At point 406 on the time scale, the stability step begins. At this point, the prior art typically stabilizes the pressure within chamber interior 226 at the process pressure set point, i.e., the pressure at which strip ashing is conducted (which may be 900 mT in one prior art example). As mentioned earlier, pressure within chamber interior 226 is regulated by withdrawing an appropriate amount of gas through exhaust port 240 of FIG. 2 (using automatic pressure control system 242).

At point 408, RF power source 228 is turned on. The introduction of RF power excites the gas within chamber interior 226, causing the pressure therein to increase. Pressure increases to point 410, causing automatic pressure control system 242 to engage to compensate and bring pressure down to the process pressure set point of 900 mT. The pressure within chamber interior 226 stabilizes at the process pressure set point of 900 mT at point 412 in FIG. 4. Once stabilized, the ash may begin. At point 414, the ash is completed.

When gap 208 is increased, the larger volume of chamber interior 226 causes a greater amount of pressure increase when RF power supply 228 is turned on. Again, automatic pressure control system 242 engages at point 416 to compensate. However, the greater amount of pressure variation in chamber interior 226 due to a larger gap 208 lengthens the stability step. The pressure within chamber interior 226 does not stabilize at the process pressure set point of 900 mT until point 418. Because the ash process does not begin until pressure is stabilized at the process pressure set point of 900 mT, ashing begins later with the ash process associated with line 404, compared with the ash process associated with line 402 (at point 418 which is later in time than point 412).

Because ashing did not begin until point 418 on line 404, which is later in time than point 412 on line 402, it did not end until point 420 on line 404, which is later in time than point 414 on line 402. Accordingly, the ash process associated with a larger gap 208 takes longer from the moment the stabilize step begins until the time the ash ends (from point 406 to point 420 on the timeline). As shown in FIG. 4, this duration is clearly longer than the ash process associated with a narrow gap (associated with line 402), which begins at point 406 and ends at point 414.

To some semiconductor manufacturers, the increase in the time required for an ash cycle due to an enlarged gap distance results in an unacceptably low substrate throughput (i.e., productivity), and an unacceptably high cost of ownership. The invention provides, in accordance with one aspect of the present invention, novel and nonobvious pressure compensation techniques to minimize the duration of the stabilization step. As mentioned earlier, reducing the duration of the pressure stabilization step advantageously reduces the total duration of an ash cycle, thereby increasing substrate throughput and productivity.

Figure 5:
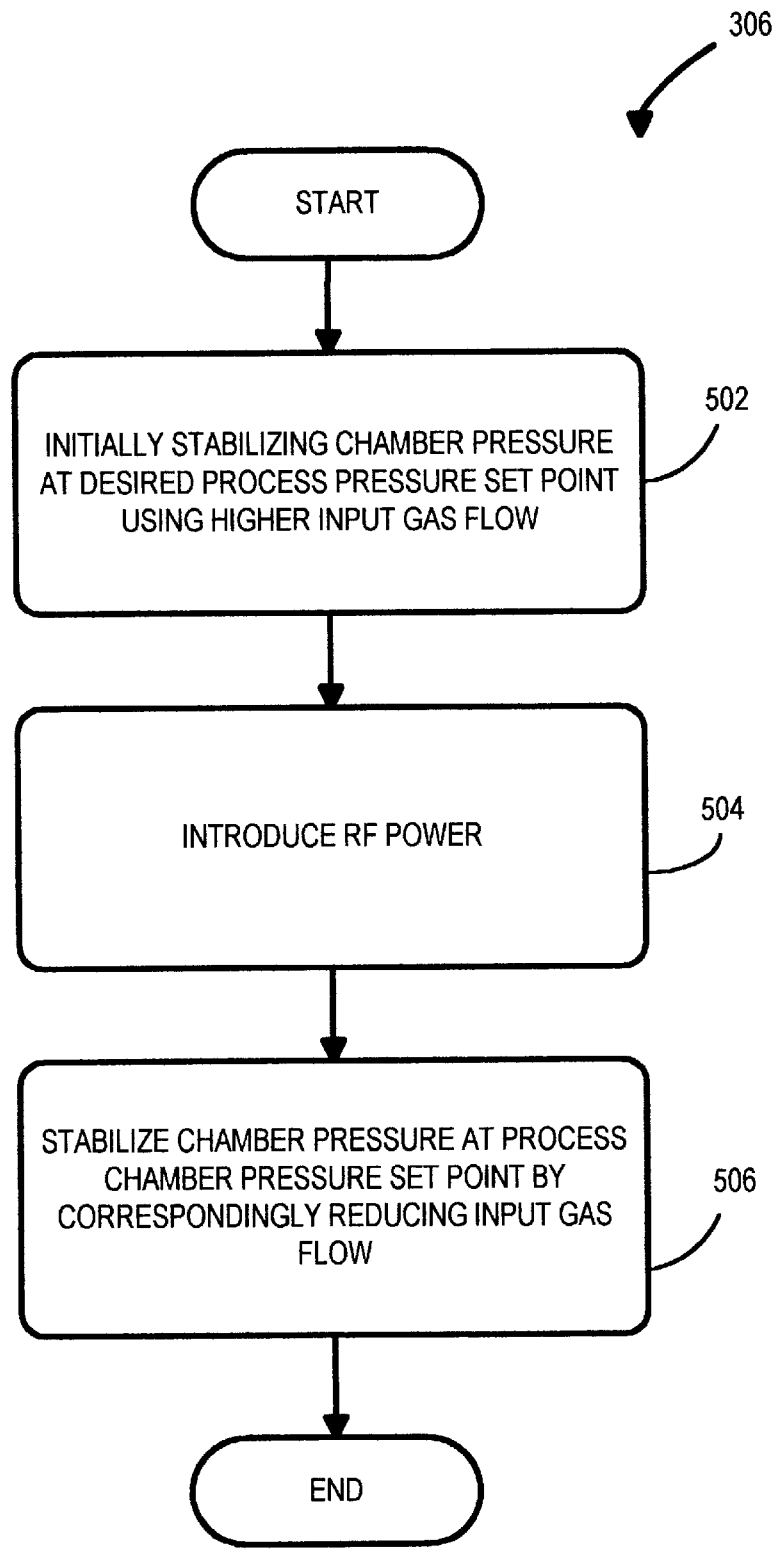
FIG. 5 is a flowchart illustrating, in accordance with one aspect of the present invention, the steps involved in the stabilizing pressure step of FIG. 3.

FIG. 5 is a flowchart illustrating, in accordance with one aspect of the present invention, the steps involved in the stabilizing pressure step 306 of FIG. 3. In step 502, the pressure set point for the pressure within the chamber interior is initially set to be lower than the desired process pressure set point. By way of example, if the desired process pressure set point is about 900 mT during plasma controlled partial ashing of the photoresist layer, the pressure within the chamber interior is initially stabilized at a lower value, e.g., about 100 mT lower or at about 800 mT. The initial stabilization of the pressure within the chamber interior (e.g., chamber interior 226) may be accomplished by dialing in the lower pressure value into the automatic pressure control system (e.g., APC system 242 of FIG. 2) so that a lower initial chamber interior pressure is achieved.

In step 504, the RF power source is turned on to strike a plasma with the ash source gasses within the chamber interior. As expected, the introduction of RF energy excites the ash source gas molecules and causes pressure within the chamber interior to increase. In step 506, a chamber pressure within the chamber interior is stabilized at the process pressure set point, e.g., using the aforementioned automatic pressure control system.

Figure 6:
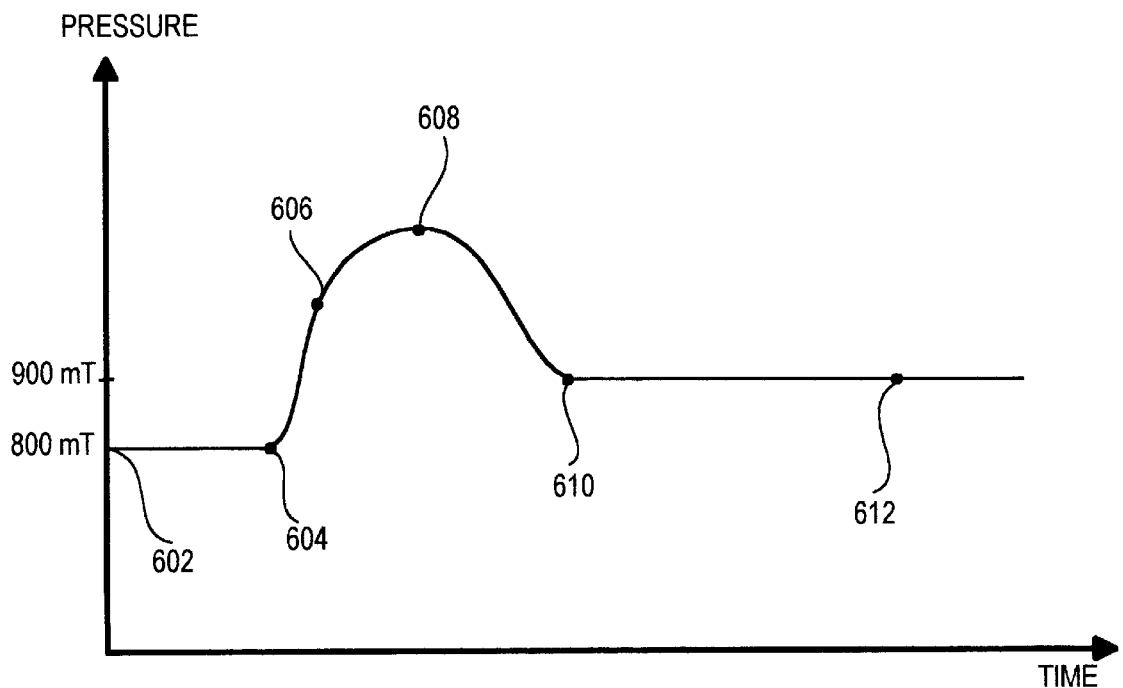
FIG. 6 illustrates, in accordance with one embodiment of the present invention, the pressure versus time plot for a controlled partial ash process which employs the pressure stabilization technique of FIG. 5.

The advantages associated with the inventive pressure stabilization technique of FIG. 5 may be better understood with reference to FIG. 6. FIG. 6 illustrates, in accordance with one embodiment of the present invention, the pressure versus time plot for a controlled partial ash process which employs the pressure stabilization technique of FIG. 5. In FIG. 6, the desired process pressure set point, i.e., the chamber pressure at which plasma controlled partial ashing is conducted, is about 900 mT.

In step 502, the chamber pressure is initially stabilized at a lower pressure, e.g., 800 mT, at point 602. At point 604, the RF power is turned on as discussed earlier in connection with step 504 of FIG. 5. RF excitation causes the pressure within the chamber interior to increase and the automatic pressure control system begins to compensate at about point 606 of the plot. At about point 608, the chamber pressure peaks out and begins to settle down towards the desired process pressure set point. At point 610, the chamber interior pressure reaches the desired process pressure set point (900 mT in this example), and ashing begins. The plasma ashed step ends at point 612.

Note that since pressure is initially stabilized at a lower pressure than the desired process pressure set point, the chamber pressure peaks at a lower value (at point 608 on the pressure scale). Advantageously, the difference in pressure between this peak point 608 and the desired process pressure (at point 610), is smaller than the difference shown by line 404 of FIG. 4. Advantageously, the time required to lower the chamber interior pressure from point 608 to point 610 is shorter, thereby advantageously shortens the stabilization step (between point 602 and point 610), which shortens the overall duration of the ash cycle (between point 602 and point 612 on the time scale).

Although the chamber interior is stabilized in the example of FIG. 6 at about 100 mT below the desired process pressure set point, the invention is not so limiting. The value (from the desired process pressure set point) by which the chamber interior pressure is lowered during the initial stabilization step 502 may be varied to suit the requirements of a particular process and the response characteristics of the automatic pressure control system In general, as the desired process pressure set point is decreased, this value tends to be smaller.

In another embodiment, the pressure within the chamber interior may be stabilized by initially stabilizing the pressure at the desired process pressure set point, albeit at a higher gas flow than the desired gas flow set point. For example, if the desired total gas flow of $O_2$ into chamber interior 226 is about 150 sccm and the desired process pressure set point is about 900 mT, the chamber interior may be stabilized initially at about 900 mT, albeit at an elevated rate of gas flow, e.g., about 170 sccm of $O_2$.

Figure 7:
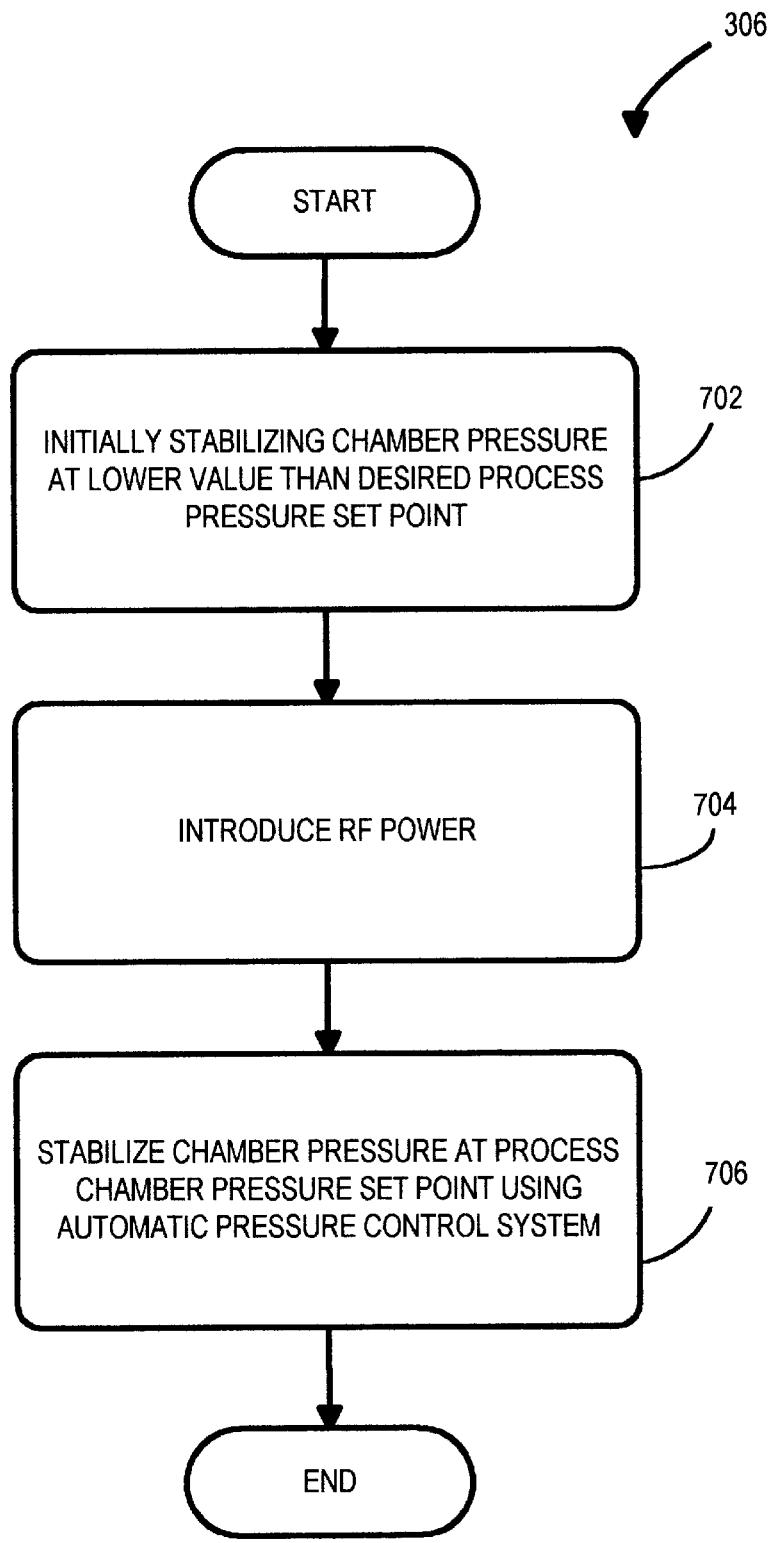
FIG. 7 illustrates, in accordance with one embodiment of the present invention, the steps involved in stabilizing the pressure wherein the chamber pressure is initially stabilized at the desired process pressure set point, albeit with a greater rate of gas flow.

After RF power is introduced and the pressure within the chamber interior begins to increase, the gas flow into the chamber interior may be correspondingly reduced to keep the chamber interior pressure stable at the desired process pressure set point. FIG. 7 illustrates this embodiment wherein the chamber pressure is initially stabilized at the desired process pressure set point, albeit with a greater rate of gas flow. Step 704 represents the step wherein the RF power is introduced to strike a plasma from the ash source gas. In step 706, the gas flow is reduced correspondingly to maintain the chamber interior pressure at the desired process pressure set point.

In some cases, the rate of gas flow of the ash source gasses may be limited by the capacity of the mass flow controller (MFC). In these cases, it may not be possible to increase the rate of ash source gas flow during step 702. In one embodiment, another inert gas, such as helium may be employed to initially stabilize the chamber pressure with a higher rate of gas flow. As the pressure increases with the introduction of RF power, the flow rate of this additional gas may be shut off to continue maintaining the chamber interior pressure at the desired process pressure set point and the desired process flow rate. Notice that this additional gas is employed only to make the stabilization process more efficient, and not as a component of the ash source gas during partial ashing.

Figure 8:
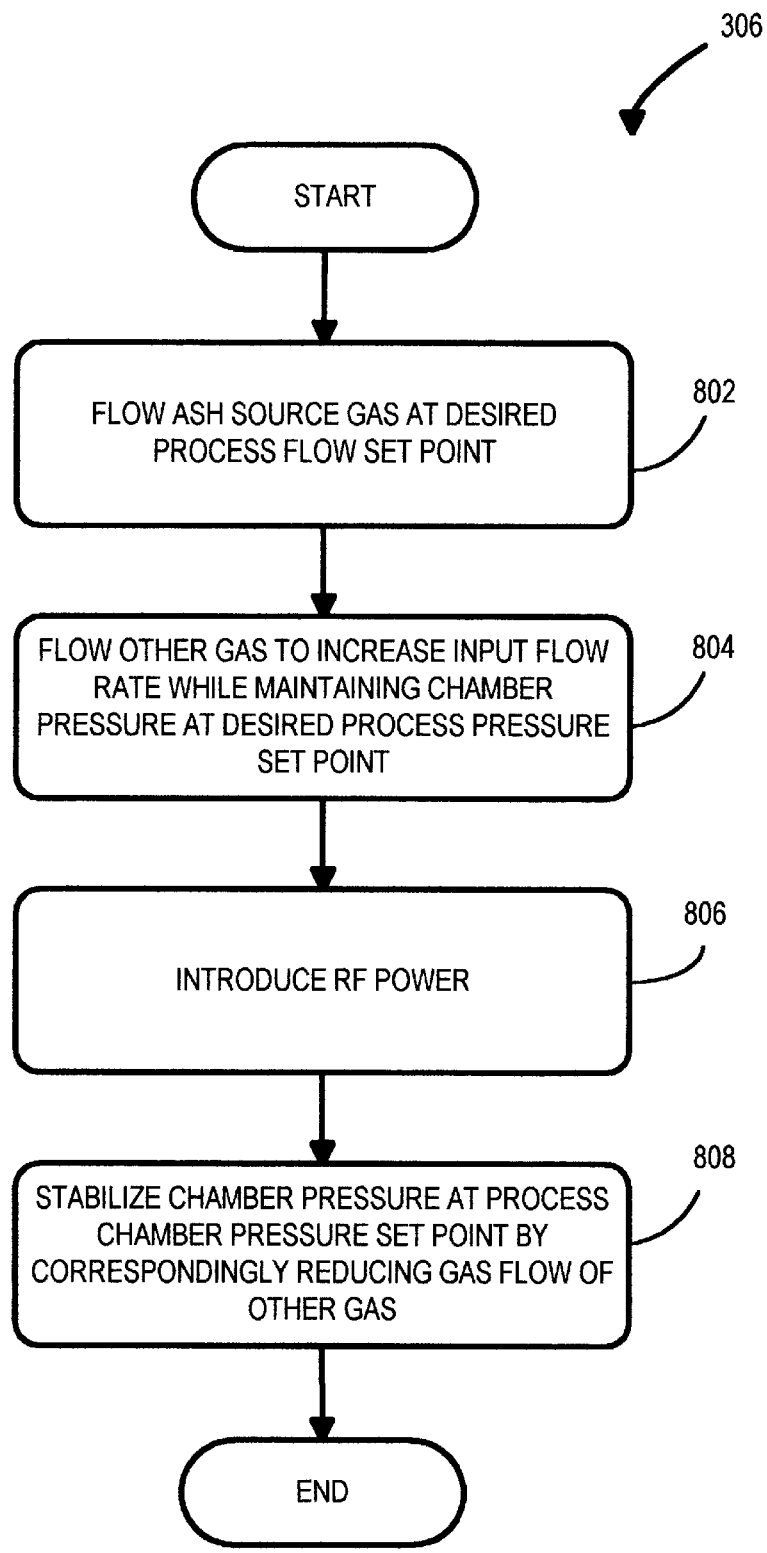
FIG. 8 illustrates, in accordance with one embodiment of the present invention, wherein another gas other than the ash source gas is employed to achieve the initial greater rate of gas flow.

FIG. 8 illustrates this embodiment wherein an additional gas is employed to stabilize the chamber interior pressure in accordance with one embodiment of the inventive pressure stabilization technique. In step 802 the ash source gas is flowed into the chamber interior at the process flow set point. In step 804, another gas (e.g., helium) is flowed into the chamber interior. The automatic pressure control system maintains the chamber interior pressure at the desired process pressure set point, albeit at a higher total flow rate. In step 806, RF power is introduced, which strikes a plasma from the ash source gasses and causes the chamber interior pressure to increase. In step 808, the flow of the other gas (e.g., helium) is correspondingly reduced to maintain the chamber interior pressure at the desired process pressure set point and the desired process flow rate.

In accordance with one aspect of the present invention, the use of wide gap 208 permits the gap to be substantially fixed at the same gap distance as the substrate is introduced to the chamber, as the substrate undergoes controlled partial ash, and as the substrate is unloaded from the chamber. In one particularly advantageous embodiment of the present invention, the loading of the substrate, the controlled partial ashing of the photoresist mask, and the unloading of the substrate from the variable-gap plasma processing chamber all take place while gap 208 is maintained at the default gap value of the variable-gap plasma processing chamber. In the Rainbow 4400™ the default gap value may be for example, 5.53 cm. If the entire sequence of loading the substrate, performing controlled partial ashing of the photoresist mask, and unloading the substrate from the variable-gap plasma processing chamber can be performed at this same default gap setting, there is advantageously no need for gap 208 to alter, and no need for upper backing plate 210 to move.

To fully explain the features and advantages in connection with the fixed-gap controlled partial ash embodiment, reference may be made again to FIG. 2. As mentioned earlier, the prior art strip ash process, which is employed to strip the photoresist layer, typically requires a fairly narrow gap 208, e.g., about 1.5 cm, to obtain a high flux density and achieve the strip ash process's goal of fast stripping. The prior art gap clearance is typically insufficient to ensure the proper loading and unloading of substrate 204. By way of example the robot arm that is typically employed to move substrate 204 from load lock 244 into chamber interior 226 and to position substrate 204 on a lower electrode 202 typically requires a gap clearance greater than the aforementioned gap distance of 1.5 cm Likewise, when strip ash is completed and substrate 204 is lifted off lower electrode 202 (employing for example, lifter pin 246), a gap clearance greater than the above-mentioned 1.5 cm must be provided to permit the robot arm to move the etched substrate from chamber interior 226 into load lock 244.

To provide the required gap clearance for proper loading and unloading, the prior art strip ash technique requires that movable backing plate 210 (and upper electrode 206) be moved away from lower electrode 202 during the loading of substrate 204. Gap drive motor 216 then engages to lower movable backing plate 210 (and upper electrode 206) toward substrate 204, thereby maintaining a proper gap 208 between the lower surface of upper electrode 206 and the upper surface of substrate 204 to facilitate strip ashing. When strip ashing is completed, gap drive motor 216 then engages to raise movable backing plate 210 (and upper electrode 206) away from substrate 204 to facilitate the unloading of the substrate from chamber interior 226.

Through experience, it has been found, however, that the moving of movable backing plate 210 creates many disadvantages. By way of example, because of the pressure differential between chamber interior 226 and the ambient pressure, a large amount of stress is typically imposed on the gap drive assembly (e.g., on lead screws 212, chain 214, and/or gap drive motor 216), whenever gap drive motor 216 is engaged to move movable backing plate 210 toward or away from substrate 204. Accordingly, the gap drive assembly has been found to be susceptible to a high degree of wear and frequent failures, necessitating the temporary cessation of the etching operation for maintenance and/or replacement. The high frequency of maintenance and/or repair reduces the throughput of the plasma processing system, i.e., reduces the number of substrates that can be stripped over a given period of time, thereby increasing the plasma processing system's overall cost of ownership.

Further, it has been found that rubber seals 220 degrade over time. When seals 220 wear away, some of the seal material, e.g., rubber particles, may be introduced into chamber interior 226, thereby increasing the level of particulate contaminants within chamber interior 226, and the defect density in the resulting semiconductor device. Further, worn seals may cause atmospheric leaks, which further introduce unwanted contaminants in the chamber.

Still further, the seal lubrication material employed to reduce friction between seals 220 and chamber wall 224 when movable backing plate 210 slides along the chamber wall may age over time, causing lubrication particles to flake off into chamber interior 226, further increasing the level of p articulate contamination therein and increasing the defect density in the etched semiconductor devices.

Despite the disadvantages associated with variable-gap plasma processing systems, some semiconductor manufacturers have nevertheless found themselves in a situation wherein a large amount of capital has already been expended to acquire variable-gap plasma processing systems. The capital investment in variable-gap plasma processing systems requires that the use of variable-gap plasma processing systems continue to justify their acquisition costs, at least until the acquisition costs are recouped. Consequently, manufacturers continue to find ways to maximize use of their variable-gap plasma processing systems.

As discussed earlier, the invention permits, in accordance with one embodiment, controlled partial ashing to be performed in a variable-gap plasma processing chamber while the gap is fixed, e.g., at the default gap distance. This embodiment is advantageous partially because it permits manufacturers to continue to employ variable-gap plasma processing systems to perform the inventive controlled partial ash process, thereby permitting semiconductor manufacturers to continue leveraging their investments in the variable-gap plasma processing systems, which may be quite expensive to acquire originally.

Because the entire loading, controlled partial ashing, and unloading sequence may be performed at a fixed gap, there is advantageously no need to employ the gap drive assembly to vary the gap between the upper electrode and the substrate. Advantageously, maintenance issues associated with employing the gap drive assembly to raise and lower the upper movable backing plate (and the upper electrode which is attached thereto) are substantially eliminated. Further, less wear is experienced by the rubber seals, thereby reducing the level of particulate contamination in the chamber interior due to the rubber particles and/or lubrication film flaking.

Figure 9:
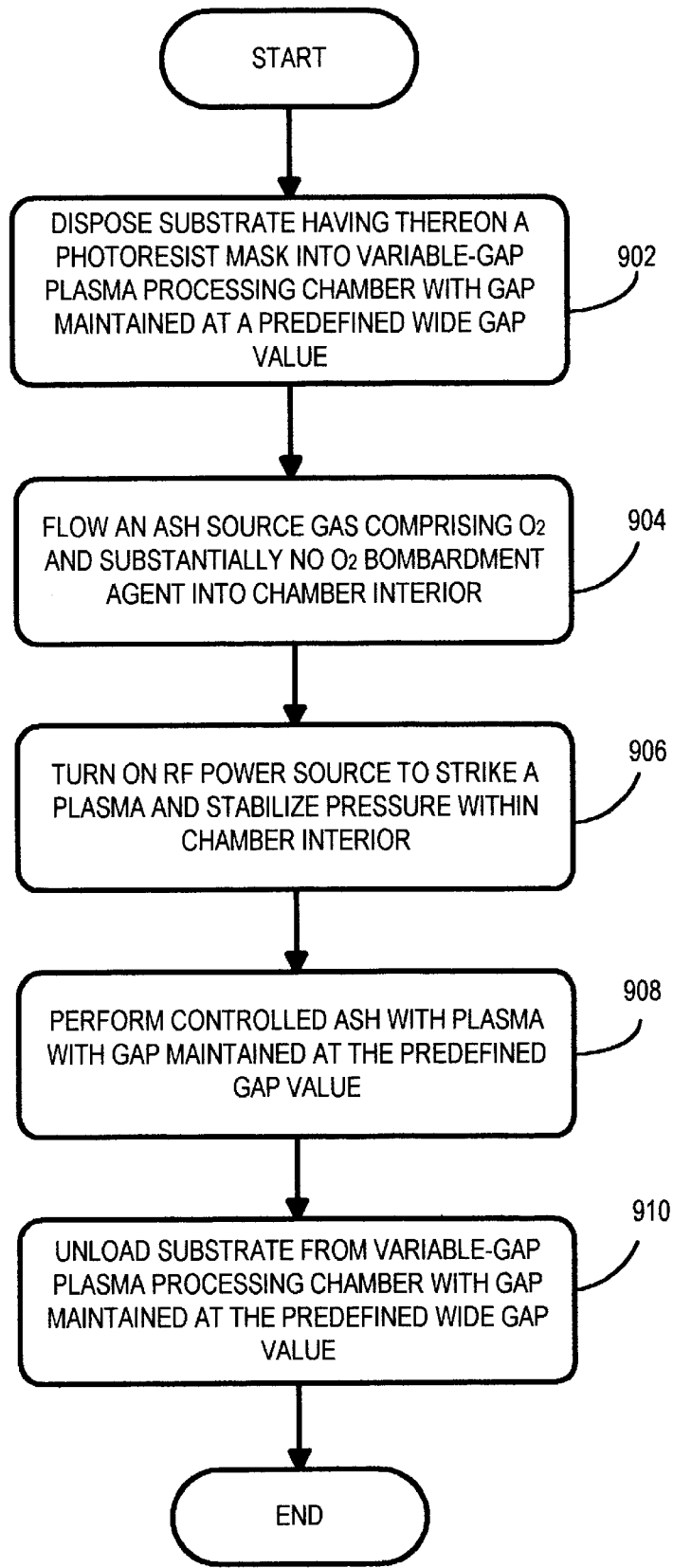
FIG. 9 illustrates, in accordance with one aspect of the present invention, the steps involved in performing the inventive fixed-gap controlled partial ash technique in a variable-gap plasma processing chamber.

FIG. 9 illustrates, in accordance with one aspect of the present invention, the steps involved in performing the inventive fixed-gap controlled partial ash technique in a variable-gap plasma processing chamber. In one embodiment, the variable-gap plasma processing chamber represents one wherein electrodes of parallel-plate types are employed to produce the plasma for ashing. In step 902, a substrate having thereon a photoresist mask is disposed in a variable-gap plasma processing chamber while the gap is at a predefined wide gap value. More preferably, the predefined wide gap value represents the default gap value of the variable-gap plasma processing system. As is known, a variable-gap plasma processing system may have a default gap value, e.g., for loading and unloading of substrates. In one embodiment, the gap employed in step 902 may be above about 3 centimeters (cm), more preferable above about 5 cm and most preferably at about 5.53 cm. Note that this wide gap value is substantially greater than the prior art gap of about 1.5 centimeters.

In step 904, an ash source gas which includes $O_2$ and which is substantially free of an $O_2$ bombarding gas is flowed into the variable-gap plasma processing chamber. In step 906, the RF power source of the variable-gap plasma processing chamber is turned on to supply RF energy to the chamber to strike a plasma from the ash source gas and to stabilize pressure within the chamber interior. The inventive pressure stabilization techniques discussed earlier in connection with FIGS. 5, 6, 7, and 8 may be employed in step 906 as well.

In step 908, the controlled partial ash process is performed with gap 208 set at about the predefined wide gap value of step 902. In step 910, the substrate may be unloaded from the variable-gap plasma processing chamber after controlled partial ashing is completed. The substrate is preferably unloaded while the gap is maintained at about the predefined wide gap value of step 902. Since the gap is substantially unchanged through the steps of FIG. 9, the aforementioned disadvantages associated with altering the gap (as is done in prior art strip ash techniques) are substantially obviated.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a variable-gap plasma processing chamber, a method for controlled removal of at least a portion of an upper crust of a photoresist layer disposed above a substrate, said crust having been formed during a first etch step, comprising:

loading said substrate into said variable-gap plasma processing chamber;

flowing an ash source gas comprising $O_2$ into said variable-gap plasma processing chamber, said ash source gas being substantially free of an $O_2$ bombarding gas;

performing said controlled removal of said at least said portion of said upper crust of said photoresist layer with a plasma struck from said ash source gas while a gap between an upper surface of said substrate and an upper electrode of said variable-gap plasma processing chamber is maintained at a wide gap distance, said wide gap distance being sufficiently wide for said substrate to be loaded into said variable-gap plasma chamber without having to alter said gap wherein the rest of said photoresist layer functions as an etch mask in a second etch step, the rate of said controlled removal being less than about 1000 angstroms per minute; and leaving the rest of said photoresist layer to be used as an etch mask in a second etch step.

2. The method of claim 1 wherein said loading is performed while said gap is maintained at said wide gap distance, said method further comprising:

removing said substrate from said variable-gap plasma processing chamber after said performing said controlled removal while said gap is maintained at said wide gap distance.

3. The method of claim 1 further comprising:

stabilizing a chamber pressure within said variable-gap plasma processing chamber to a process pressure set point prior to said controlled removal.

4. The method of claim 3 wherein said stabilizing comprises:

stabilizing said chamber pressure to a first pressure set point, said first pressure set point being lower in value than said process pressure set point;

introducing radio frequency power into said variable-gap plasma processing chamber to strike said plasma; and stabilizing said chamber pressure to said process pressure set point after said introducing.

5. The method of claim 4 wherein said first pressure set point is lower than said process pressure set point by about 100 mT.

6. The method of claim 4 wherein said process pressure set point is about 900 mT.

7. The method of claim 4 wherein said stabilizing said chamber pressure to said process pressure set point after said introducing comprises reducing said chamber pressure to said process pressure set point by withdrawing gas from said variable-gap plasma processing chamber.

8. The method of claim 3 wherein said stabilizing comprises:

initially stabilizing said chamber pressure to said process pressure set point;

introducing RF power into said variable-gap plasma processing chamber to strike said plasma; and stabilizing said chamber pressure to said process pressure set point after said introducing by reducing a gas input flow rate into said variable-gap plasma processing chamber.

9. The method of claim 8 wherein said reducing said gas input flow rate comprises reducing a flow rate of said $O_2$.

10. The method of claim 1 wherein said controlled removal is performed at a chamber pressure of about 700 mT to about 1200 mT.

11. The method of claim 10 wherein said controlled removal is performed at a chamber pressure of about 900 mT, a top RF power of about 650 watts, and a bottom electrode temperature of about 40° C.

12. The method of claim 1 wherein said wide gap distance is greater than about 4 cm.

13. The method of claim 12 wherein said wide gap distance is about 5.5 cm.

14. The method of claim 1 wherein said substrate is employed in the manufacture of integrated circuits.

15. The method of claim 1 wherein said substrate is disposed on a lower electrode in said variable-gap plasma processing chamber, said lower electrode and said upper electrode representing parallel plate electrodes.

16. In a plasma processing chamber, a method for controlled removal of at least a portion of an upper crust of a photoresist layer, said photoresist layer being disposed above a substrate, said upper crust representing an upper layer of said photoresist layer that has been hardened during a first etch step, said controlled removal leaving a remaining thickness of said photoresist layer sufficiently protective of an underlying layer disposed below photoresist features of said remaining thickness of photoresist layer during a subsequent second etch step subsequent to said first etch step and said controlled removal, comprising:

loading said substrate having thereon said upper crust into said plasma processing chamber;

flowing an ash source gas comprising $O_2$ into said plasma processing chamber, said ash source gas being substantially free of an $O_2$ bombarding gas; and performing said controlled removal of said at least said portion of said upper crust of said photoresist layer with a plasma struck from said ash source gas, said performing said controlled removal being arranged to remove said at least said portion of said upper crust of said photoresist layer at a reduced ash rate, said reduced ash rate being sufficiently slow to permit said performing said removal to take place over a duration sufficient to yield ash uniformity adequate to render said photoresist features sufficiently protective of said underlying layer during said subsequent second etch step, said reduced ash rate being less than about 1000 angstroms per minute.

17. The method of claim 16 wherein said performing said controlled removal is performed while a gap between an upper surface of said substrate and a lower surface of an upper electrode in said plasma processing chamber is at least about 3 cm.

18. The method of claim 17 wherein said plasma processing chamber represents a variable-gap plasma processing chamber.

19. The method of claim 18 wherein said ash source gas consists essentially of $O_2$.

20. The method of claim 19 wherein said gap is substantially unchanged during said loading and said performing said controlled removal.

21. The method of claim 20 wherein said gap represents a default gap distance of said variable-gap plasma processing chamber, said default gap distance representing a gap distance that exists by default during said loading said substrate.

22. The method of claim 20 wherein said performing said removal takes place while a minimal amount of RF power is supplied to said upper electrode, wherein said minimal amount of RF power represents about the smallest RF power sufficient to maintain said plasma within said variable-gap plasma processing chamber.

23. The method of claim 18 wherein said duration is at least about five seconds.

24. The method of claim 23 wherein said substrate is employed in the manufacture of integrated circuits.

25. The method of claim 24 wherein said first etch step represents one of a polysilicon etch step and an oxide etch step, said subsequent second etch step represents the other of said polysilicon etch step and said oxide etch step.

26. In a variable-gap plasma processing chamber, a method for controlled removal of at least a portion of an upper crust of a photoresist layer, said crust being formed during a first etch step said photoresist layer being disposed above a substrate, said controlled removal leaving a remaining thickness of said photoresist layer sufficiently protective of an underlying layer disposed below photoresist features of said remaining thickness of photoresist layer during a second etch step performed subsequent to said controlled removal, comprising:

loading said substrate having thereon said upper crust into said plasma processing chamber while a gap between an upper surface of said substrate and an upper electrode of said variable-gap plasma processing chamber is maintained at a fixed gap distance;

flowing an ash source gas comprising $O_2$ into said variable-gap plasma processing chamber, said source gas being substantially free of an $O_2$ bombarding gas; and performing said controlled removal of said at least said portion of said upper crust of said photoresist layer with a plasma struck from said ash source gas, said performing said controlled removal being performed while said gap is maintained at substantially said fixed gap distance, the rate of said controlled removal being less than about 1000 angstroms per minute.

27. The method of claim 26 further comprising unloading said substrate from said variable-gap plasma processing chamber after said performing said controlled removal without substantially varying said gap.

28. The method of claim 27 wherein said ash source gas consists essentially of $O_2$.

29. The method of claim 27 wherein said gap represents a default gap distance of said variable-gap plasma processing chamber, said default gap distance representing a gap distance that exists by default during one of said loading said substrate and said unloading said substrate.

30. The method of claim 26 wherein said performing said controlled removal is performed while a chamber pressure within said variable-gap plasma processing chamber is maintained between about 800 mT and about 1000 mT.

31. The method of claim 26 wherein said performing said controlled removal is performed while RF power is delivered to said upper electrode at between about 300 watts and about 750 watts.

32. The method of claim 26 wherein said performing said controlled removal is performed while RF power is delivered to said upper electrode at about 650 watts and while a chamber pressure within said variable-gap plasma processing chamber is about 900 mT.

* * * * *